(12) United States Patent
Gijs et al.

(10) Patent No.: US 8,362,361 B2
(45) Date of Patent: Jan. 29, 2013

(54) METHOD FOR PRODUCING PARTS FOR PASSIVE ELECTRONIC COMPONENTS AND PARTS PRODUCED

(75) Inventors: Martin Gijs, Ecublens (CH); Jean-Pierre Reyal, Eragny (FR); Farid Amalou, Renens (CH)

(73) Assignee: IMPHY Alloys, Puteaux (FR)

( * ) Notice: Subject to any disclaimer, the term of this patent is extended or adjusted under 35 U.S.C. 154(b) by 399 days.

(21) Appl. No.: 12/550,529

(22) Filed: Aug. 31, 2009

(65) Prior Publication Data

US 2009/0314521 A1 Dec. 24, 2009

Related U.S. Application Data

(63) Continuation of application No. 10/561,439, filed as application No. PCT/FR2004/001556 on Jun. 22, 2004, now Pat. No. 7,640,641.

(30) Foreign Application Priority Data

Jun. 23, 2003 (FR) ..................................... 03 07563

(51) Int. Cl.
*H05K 1/09* (2006.01)
(52) U.S. Cl. ..................... 174/255; 174/257; 174/261
(58) Field of Classification Search ............... 174/255, 174/260, 261, 257
See application file for complete search history.

(56) References Cited

U.S. PATENT DOCUMENTS

| | | | |
|---|---|---|---|
| 4,081,601 A * | 3/1978 | Dinella et al. ................. | 174/257 |
| 4,364,020 A | 12/1982 | Lin et al. | |
| 4,608,297 A | 8/1986 | Shimada et al. | |
| 4,702,786 A | 10/1987 | Tallman | |
| 4,985,101 A | 1/1991 | Brown, Jr. | |
| 5,898,574 A * | 4/1999 | Tan et al. ....................... | 361/777 |
| 6,010,956 A | 1/2000 | Takiguchi et al. | |
| 6,228,465 B1 | 5/2001 | Takiguchi et al. | |
| 7,015,059 B2 | 3/2006 | Ooishi | |
| 7,275,316 B2 | 10/2007 | Myers et al. | |
| 7,350,296 B2 | 4/2008 | Ryu et al. | |
| 2003/0034122 A1 | 2/2003 | Asai | |

FOREIGN PATENT DOCUMENTS

| | | |
|---|---|---|
| EP | 0336771 A2 | 10/1989 |
| JP | 60169120 A | 9/1985 |
| JP | 61131518 A | 6/1986 |
| JP | 62229921 A | 10/1987 |
| JP | 3194907 A | 8/1991 |
| JP | 3231412 A | 10/1991 |
| JP | 6030309 B | 4/1994 |
| JP | 10256066 A | 9/1998 |
| JP | 2002214779 A | 7/2002 |
| JP | 2003053720 A | 2/2003 |
| JP | 2003161770 A | 6/2003 |
| JP | 2005039143 A | 2/2005 |
| WO | 0150483 A1 | 7/2001 |

\* cited by examiner

*Primary Examiner* — Jeremy Norris
(74) *Attorney, Agent, or Firm* — Sughrue Mion, PLLC

(57) ABSTRACT

A part formed of a laminated strip having at least one stack formed by alternately stacking a thin and fragile metal strip and a layer of an adhesive material. The thin and fragile metal strip is made of an alloy taken from a nanocrystalline alloy or hard and fragile alloy of the type iron-cobalt, iron-platinum, iron-silicon or iron-nickel or nickel-chrome or alloy of molybdenum or tungsten.

18 Claims, 6 Drawing Sheets

METHOD FOR PRODUCING PARTS FOR PASSIVE ELECTRONIC COMPONENTS AND PARTS PRODUCED

Figure 1A:
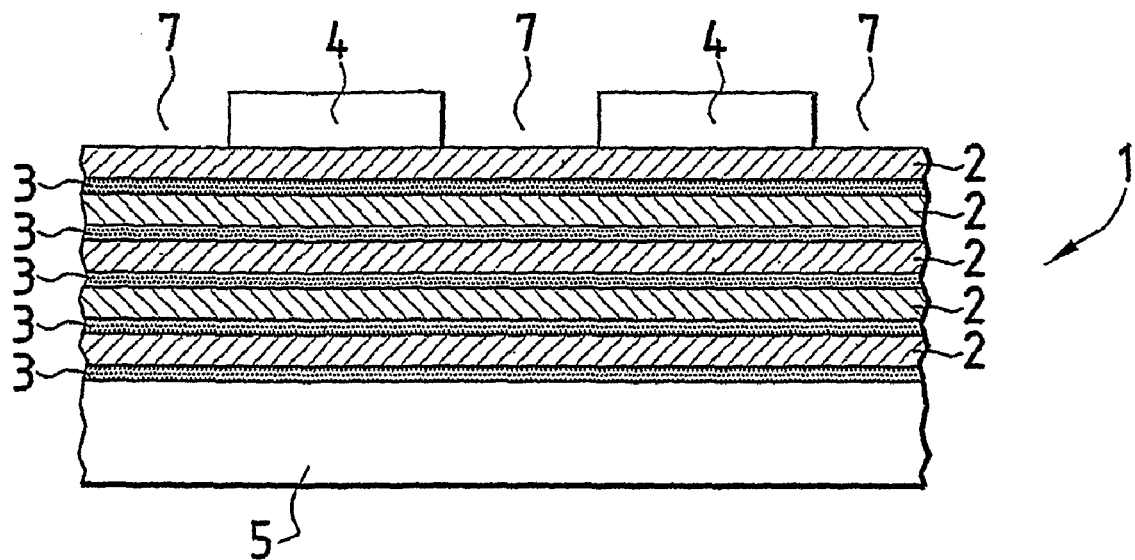

This is a continuation of application Ser. No. 10/561,439 filed Mar. 30, 2006, now U.S. Pat. No. 7,640,641 which is a national stage entry application of PCT/FR04/01556 filed Jun. 22, 2004. The entire disclosure of the prior applications, application Ser. No. 10/561,439 and PCT/Fr04/01556 are considered part of the disclosure of the accompanying continuation application and are hereby incorporated by reference.

The present invention relates to a method for producing parts for passive electronic components which are produced by being cut from a laminated strip constituted by a stack of thin and fragile metal strips, and in particular thin metal strips of nanocrystalline alloy.

Nanocrystalline alloys, and in particular nanocrystalline alloys of the type Fe Cu Nb B Si or Fe Zr B Si, or other types, are well known. These alloys which have excellent magnetic properties are produced by thermally processing strips of amorphous alloy produced by means of ultra-rapid solidification of a liquid metal. However, these strips, which are particularly suitable for producing a magnetic core having a very high level of permeability, in particular at low-frequency, have the disadvantage of being extremely fragile. Therefore, in order to produce magnetic cores using these strips of nanocrystalline alloy, it has been proposed that strips of amorphous alloys are rolled up in order to form rolls, that thermal processing operations are then carried out on those rolls in order to confer a nanocrystalline structure on the alloy. Magnetic cores are thus produced which have excellent magnetic properties but which have the disadvantage of having only one possible shape, which is that of a roll.

In order to produce magnetic cores of nanocrystalline alloy having shapes other than that of rolls, it has been proposed that laminated strips be produced which are constituted by a stack of strips of a nanocrystalline alloy which are adhesively-bonded together using an adhesive or a resin, that these laminated strips then be cut using mechanical means, such as shearing or by means of laser, in order to produce cores having the desired shape. However, this technique has a disadvantage since, owing to the very fragile nature of the strips of nanocrystalline alloy, laser or mechanical cutting carries the risk of producing, at the inner side of the nanocrystalline strips, cracks which considerably impair the magnetic properties of the cores produced.

In order to be able to handle extremely fragile nanocrystalline bands more readily, a method has been proposed, in particular in patent FR 2 788 455, for assembling the nanocrystalline bands with polymer bands which allows them to be handled more readily. These nanocrystalline bands which are associated with polymer bands can then be stacked and etched in order to produce magnetic cores which can be used to produce magnetic components which are embedded in printed circuits or to produce discrete nanocrystalline magnetic components. This method which uses chemical etching has the advantage of being well mastered. However, this production technique is slow and complex, because, owing to the presence of the strips of polymer materials, on which nanocrystalline strips are adhesively-bonded, it is necessary to etch each strip before stacking the different strips in order to produce a component having the desired dimensions.

The object of the present invention is to overcome these disadvantages by providing a means for producing parts for passive electronic components, in particular magnetic electronic components, which are constituted by a stack of thin and fragile metal strips, and in particular strips of nanocrystalline alloy, and which have very diverse shapes.

To this end, the invention relates to a method for producing parts for passive electronic components, according to which a laminated strip is produced which is constituted by at least one stack of a thin and fragile metal strip and a layer of an adhesive material, and at least one part is cut from the laminated strip using a method which comprises at least one step involving etching by means of sandblasting. In this method, which is very suitable for fragile and brittle materials, the disadvantages of the nanocrystalline materials, that is to say, their fragility and the resultant problems in terms of handling, become an advantage.

Preferably, the layer of an adhesive material of the at least one stack is a layer of a fragile and hard adhesive material.

In order to carry out at least one step involving etching by means of sandblasting, there is arranged, on a face of the laminated strip, a cover composed of a material which is resistant to sandblasting, comprising openings which have at least one shape according to which it is desirable to etch the at least one laminated strip.

The cover is, for example, a steel strip which is resistant to etching by means of sandblasting, or a resilient layer, such as a layer of paint deposited by means of serigraphy, or a layer of resilient photosensitive resin which is exposed to radiation and, for example, ultraviolet radiation or electron beams through a mask which comprises appropriate cut-outs, and which is developed by means of immersion in a bath.

The laminated strip may be constituted by at least two alternate stacks of thin metal strips and layers of a fragile and hard adhesive material, the at least two alternate stacks being superimposed and separated by means of an adhesive layer, at least a portion of the surface of which is constituted by a resilient material which is resistant to etching by means of sandblasting.

In order to carry out etching by means of sandblasting, the laminated strip is preferably adhesively-bonded to a support strip. After sandblasting, the cut laminated strip and the support strip can be separated.

In order to carry out the etching by means of sandblasting, the laminated strip can be placed so as to be arranged on the support strip in a sandblasting etching chamber comprising at least one sandblasting nozzle which projects a jet of abrasive particles and a relative movement of the laminated strip and the at least one sandblasting nozzle is carried out in order to pass over the surface of the laminated strip with the jet of abrasive particles.

Using this method, it is possible to etch on the laminated strip a plurality of parts for electronic components which are connected to each other by means of attachment points, which are separated.

The fragile and hard material is, for example, an epoxy adhesive.

The thin metal strips are preferably constituted by a material selected from the following alloys: nanocrystalline magnetic alloys, fragile magnetic alloys of iron-cobalt, iron-platinum, iron-silicon, iron-nickel, fragile nickel-chromium alloys, fragile molybdenum alloys and fragile tungsten alloys.

The support strip may be a strip comprising a layer of polymer and a layer of conductive material such as copper which may further comprise, before cutting by means of sandblasting, at least one electronic component which is protected during the sandblasting cutting operation by means of a layer of resilient material.

The invention also relates to a part which can be produced using the method according to the invention and which is, for example, a core of a passive inductive electronic component which may comprise an air gap and which may also comprise at least two parts having different thicknesses.

The part may also constitute an electrical resistor or a capacitor.

The invention also relates to a plate which is intended to be incorporated in a printed circuit and which is constituted by a layer of conductive material and a layer of resilient polymer material, to which there is adhesively-bonded an electronic component part which can be produced using the method according to the invention.

The invention further relates to a method for producing a passive inductive electronic component of the type comprising a part which is cut from a laminated strip constituted by a stack of thin metal strips of a magnetic alloy, in which the part is produced using the method according to the invention and at least one winding and coating of the component with a protective material are carried out.

When the passive electronic component is capacitive or resistive, the component comprises a part which is cut from a laminated strip constituted by a stack of thin metal strips and means for electrical connection. In this case, the connection means are further produced and the component is further coated with a protective material.

Finally, the invention relates to a method for producing a printed circuit comprising at least one passive electronic component which comprises at least one part which is constituted by a laminated metal material, according to which method there is stacked and adhesively-bonded at least one plate which is constituted by a layer of conductive material and a layer of resilient polymer material, to which is adhesively-bonded a part which is produced by cutting by means of sandblasting, and at least one plate comprising a layer of polymer material.

The method of cutting by sandblasting a laminated strip which is constituted by an alternate stack of strips of very fragile magnetic metal material and layers of polymer, has the advantage of allowing magnetic parts to be produced having very different shapes which have no cracks and therefore having very good magnetic properties.

This method also allows thin parts to be produced which it is not possible to produce using known techniques. In particular, it allows toruses to be produced which have a very large ratio of diameter to thickness. These are in particular toruses having a thickness of less than 1 mm and, for example, toruses having a thickness in the region of 1 mm and a diameter greater than 10 mm, or toruses having a thickness of between 20 µm and 200 µm and a diameter which can be from 1 mm to a few millimeters.

Figure 1B:
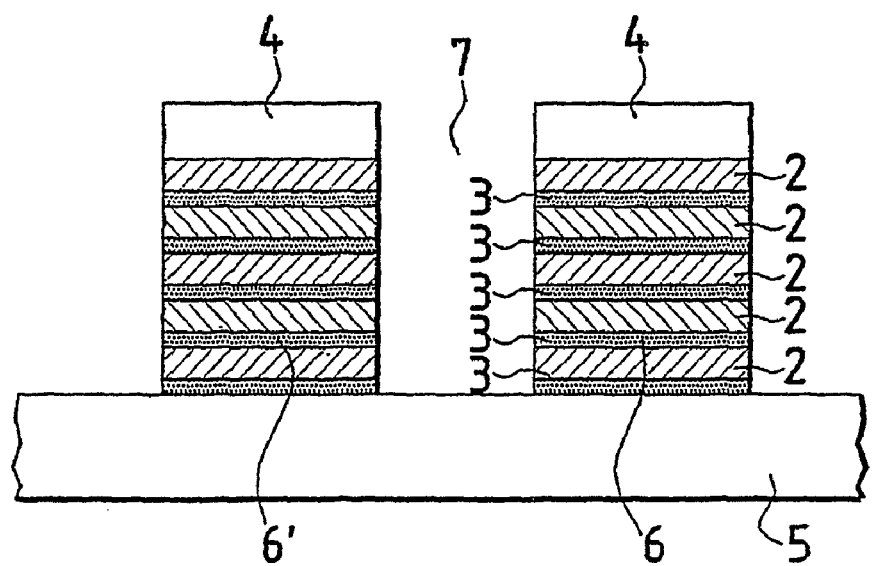
Figure 2A:
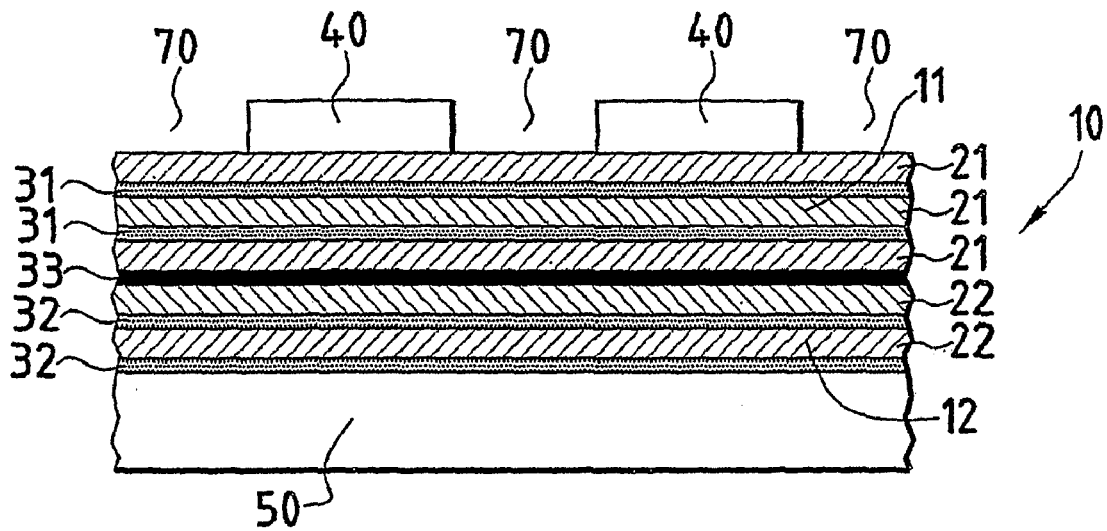
Figure 2B:
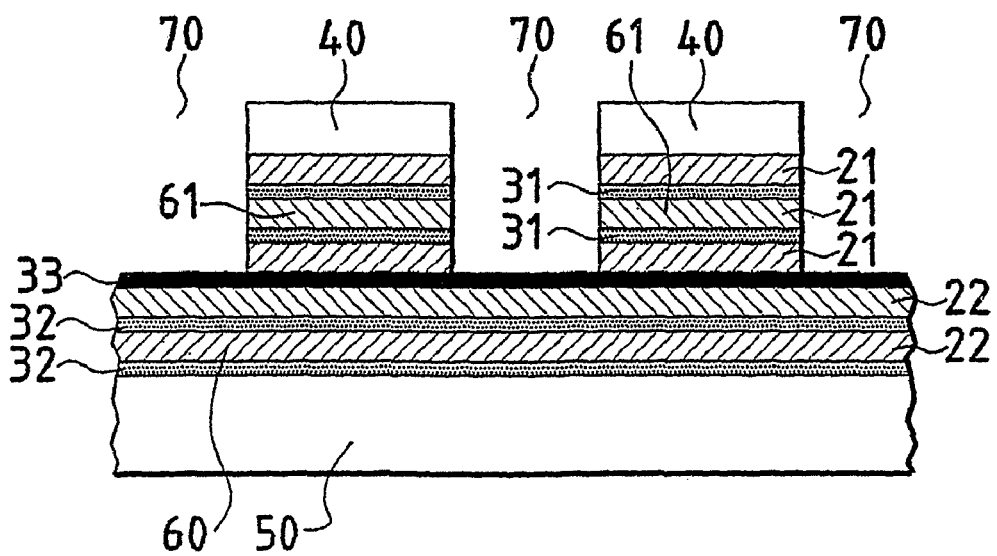
Figure 3A:
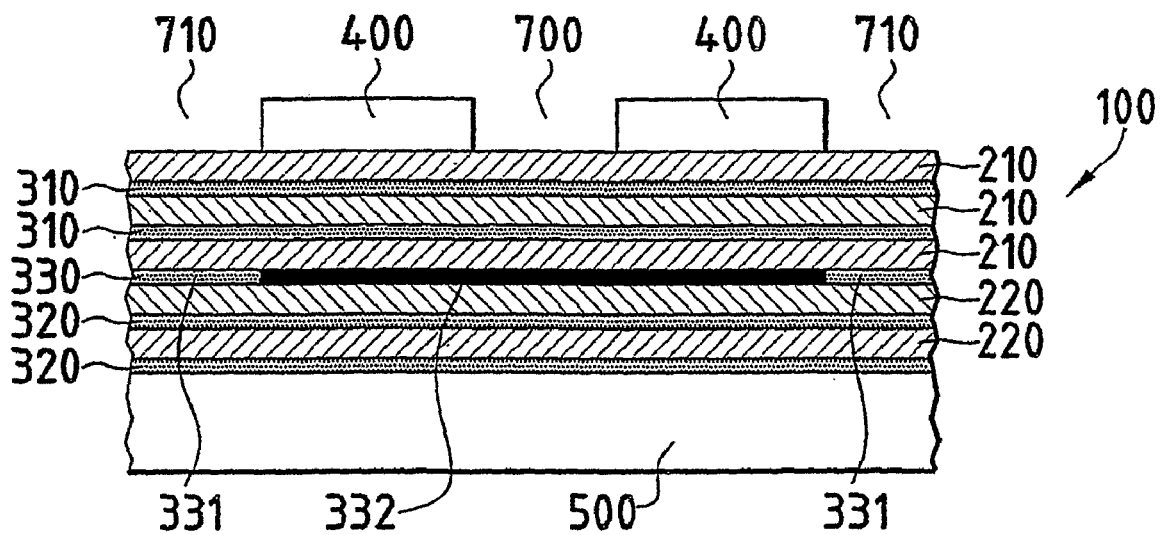
Figure 3B:
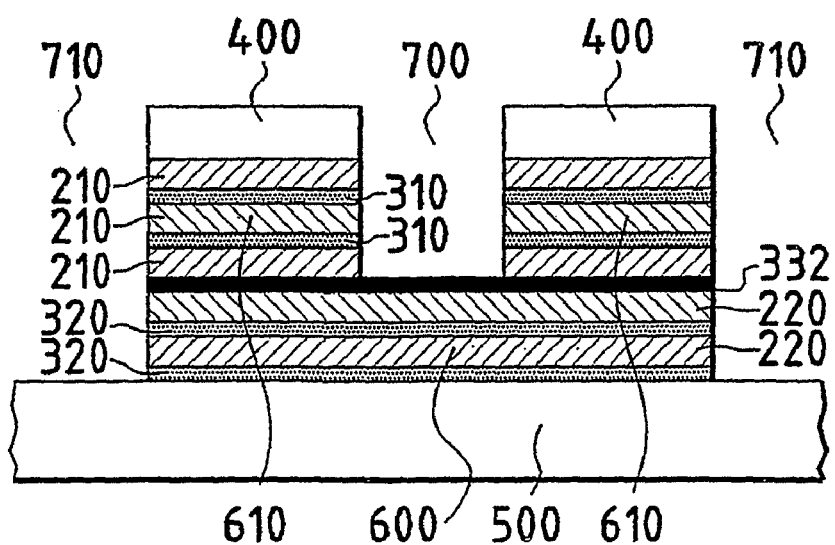
Figure 4:
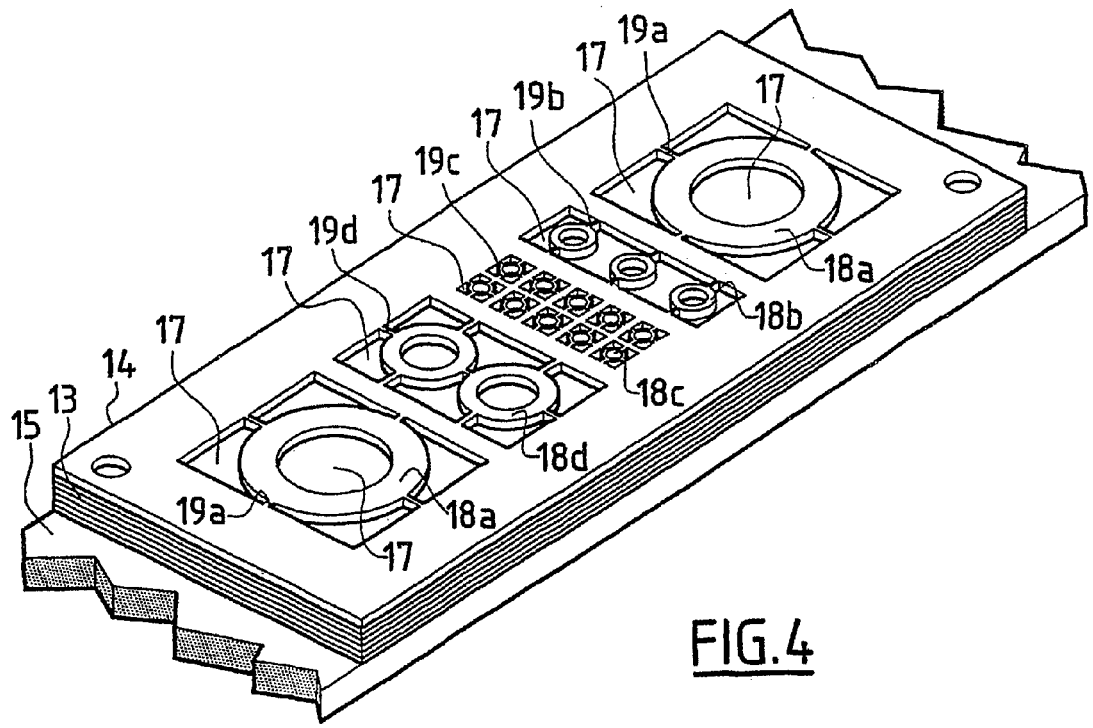
Figure 5:
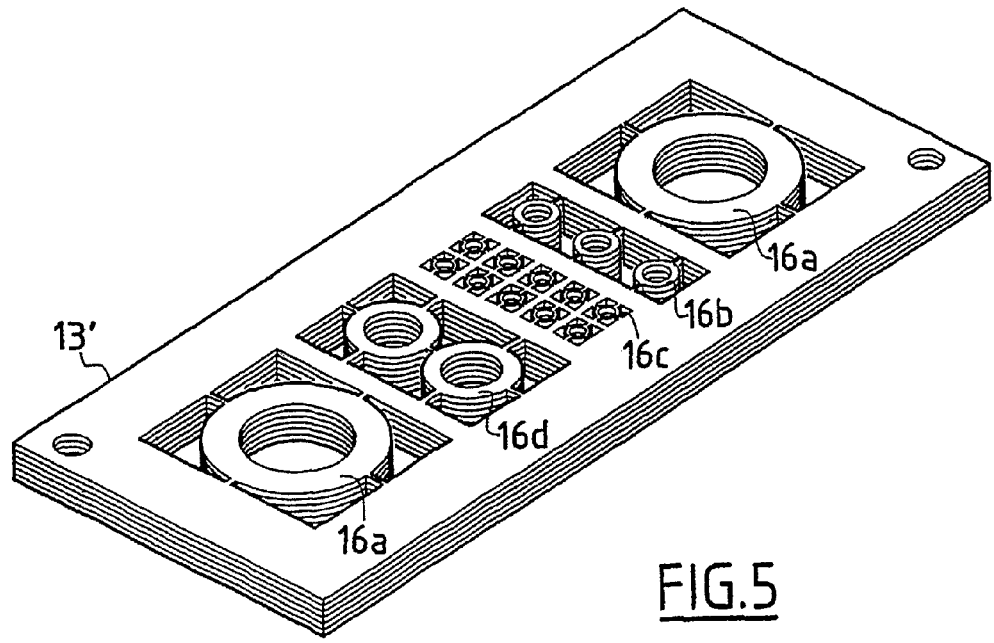
Figure 6:
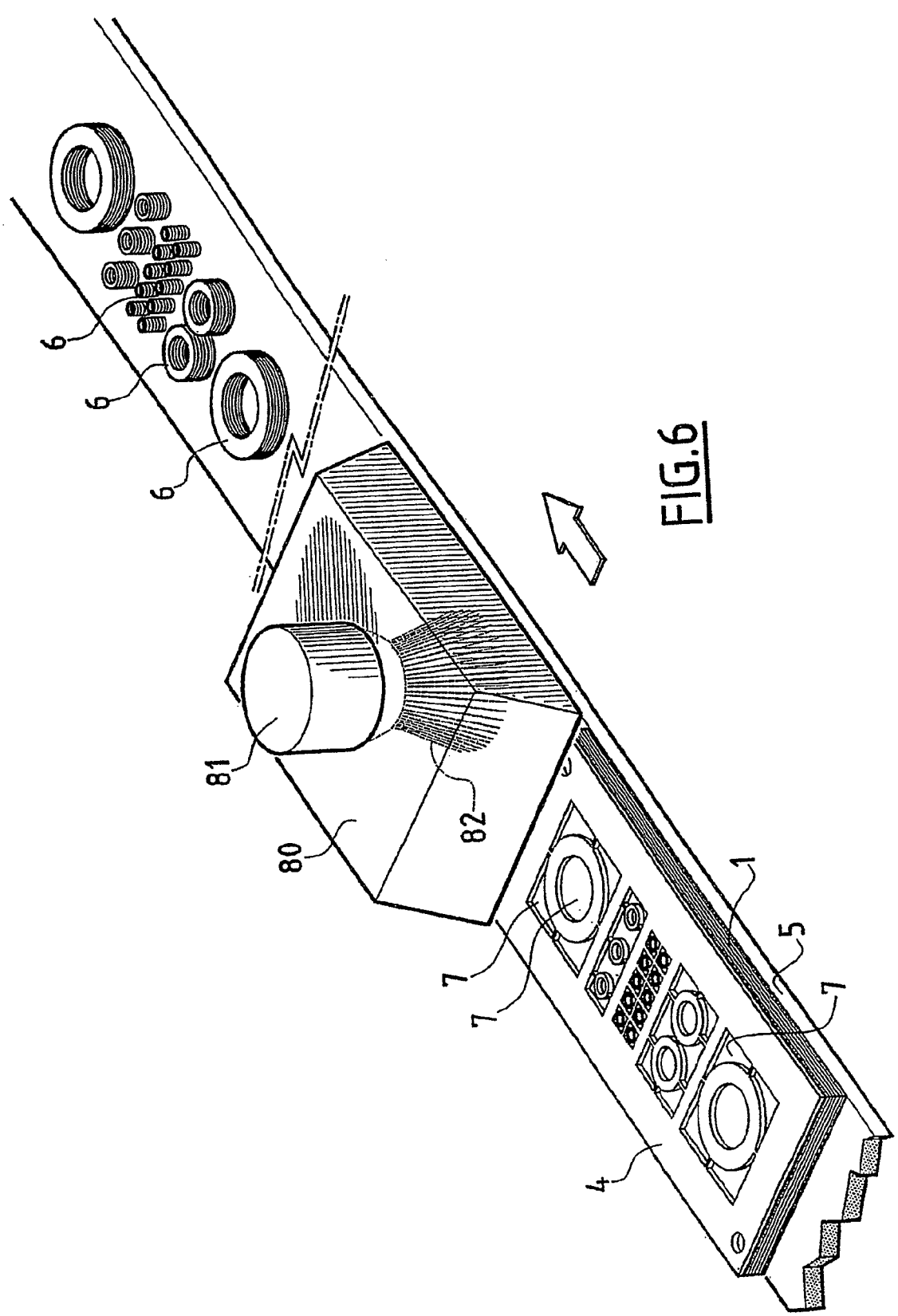
Figure 7A:
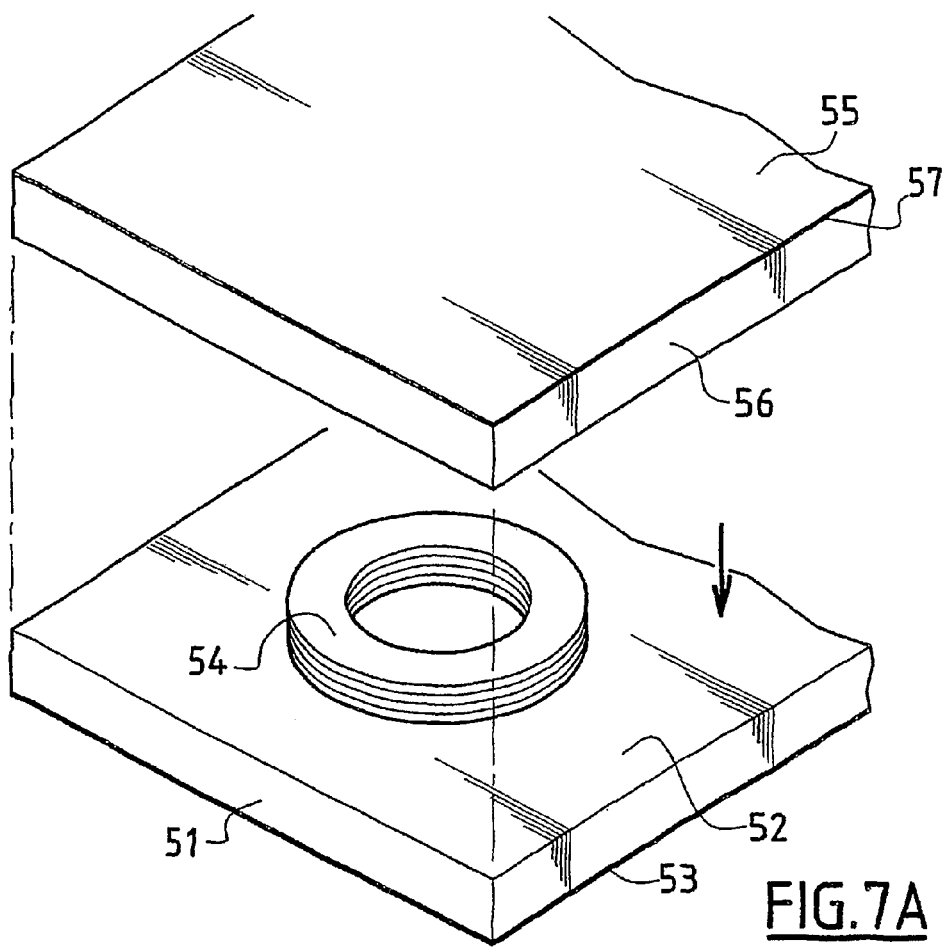
Figure 7B:
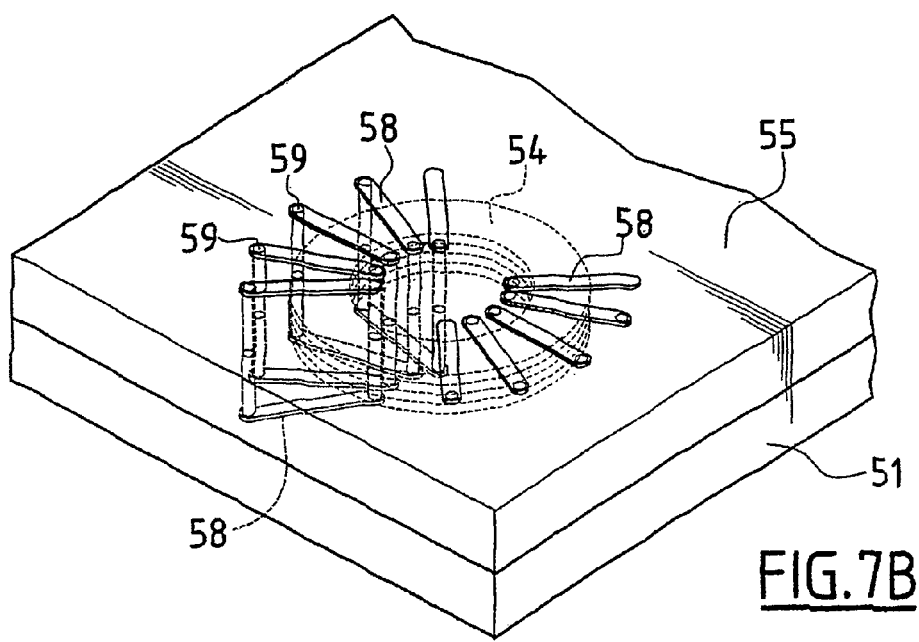

The invention will now be described in a more precise but non-limiting manner with reference to the appended drawings, in which:

FIG. 1A schematically illustrates a stack of nanocrystalline strips which are adhesively-bonded using a hard and fragile adhesive and which are arranged on a support strip, on which stack a mask is arranged, FIG. 1B illustrates the preceding stack after a sandblasting operation, FIG. 2A illustrates a laminated strip according to FIG. 2A which is constituted by stacked and adhesively-bonded nanocrystalline strips, and in which a layer of adhesive is constituted by a resilient adhesive, FIG. 2B illustrates a laminated strip according to FIG. 2A which is constituted by stacked and adhesively-bonded nanocrystalline strips, a layer of adhesive of which is constituted by a resilient adhesive, after sandblasting, FIG. 3A illustrates a laminated strip according to FIG. 2A which is constituted by nanocrystalline strips which are stacked and adhesively-bonded together, a layer of adhesive of which is partially constituted by a resilient adhesive. The laminated strip is placed on a support and a cover is arranged on the strip, FIG. 3B illustrates the strip of the preceding Figure after sandblasting, FIG. 4 illustrates an assembly which is constituted by a support strip, a laminated strip constituted by adhesively-bonded nanocrystalline strips and a cover, FIG. 5 illustrates the part produced after a sandblasting operation, FIG. 6 is a schematic illustration of the method for producing a part for a magnetic component which is cut out by means of sandblasting from a laminated strip comprising nanocrystalline strips, FIGS. 7A and 7B schematically illustrate the production of a printed circuit comprising a magnetic core which is produced by being cut from a nanocrystalline material.

The general principle of the invention consists in producing parts for passive electronic components and in particular magnetic passive electronic components, such as inductors or magnetic cores, which are produced by cutting by means of sandblasting laminated strips which are constituted by an alternate stack of fragile metal strips and layers of a hard and fragile adhesive material. The fragile metal material has magnetic properties which are suitable for producing magnetic electronic components. This material is in particular a nanocrystalline magnetic material of the type Fe—Cu—Nb—B—Si or Fe—Zr—B—Si, for example. Materials of this type are described, for example, in European Patent 0 271 657 or in European Patent 0 299 498. This nanocrystalline material which is known per se is produced by thermally processing an amorphous strip produced by means of ultra-rapid solidification of a liquid metal alloy. A thin strip of this type has a thickness of between a few micrometers and a few tens of micrometers, in particular between 5 and 50 micrometers, and generally in the order of 20 micrometers. The hard and fragile adhesive material is a polymer material and, for example, an adhesive which is either naturally hard and fragile or which is rendered hard and fragile by means of an appropriate thermal processing operation. These materials, which are generally referred to as thermosetting materials, are in particular unsaturated polyesters, epoxides, phenolics, and polyimides.

In one embodiment of the laminated strip, illustrated in FIG. 1A, the laminated strip generally designated 1 is homogeneous. It is constituted by identical thin metal strips 2 and by intermediate layers of hard and fragile adhesive material 3. In FIG. 1A, the laminated strip 1 is adhesively-bonded to a support strip 5, and a cover 4 is arranged on the upper face thereof.

In a second embodiment illustrated in FIG. 2A, the laminated strip generally designated 10 is constituted by a first homogeneous laminated layer 11 which is constituted by a stack of identical thin metal strips 21 which are separated by layers 31 of hard and fragile adhesive material and a second laminated layer 12 which is constituted by a stack of thin metal strips 22 which are separated by layers 32 of fragile and hard adhesive material. The two laminated layers are separated by an intermediate layer 33 of a resilient adhesive material. In this embodiment, the resilient intermediate layer 33 extends over the entire surface 2 of the laminated strip. The laminated strip produced in this manner is heterogeneous. As in the preceding case, the Figure illustrates a cover 40 and a support strip 50.

In a third embodiment illustrated in FIG. 3A, the heterogeneous laminated strip, generally designated 100, is constituted in the same manner as in the case above by a first laminated layer 110 constituted by a stack of thin metal strips 210 which are separated by layers 310 of hard and fragile adhesive material and a second laminated layer 120, which is constituted by a stack of thin metal strips 220 which are separated by layers 320 of hard and fragile adhesive material, the two laminated layers 110 and 120 being separated by an intermediate layer 330, of which one portion 331 is constituted by a hard and fragile material and another portion 332 is constituted by a resilient adhesive material. The Figure also illustrates a support strip 500 and a cover 400.

Other embodiments of heterogeneous laminated strips may be envisaged in which a plurality of laminated layers constituted by thin metal strips which are rendered adhesive by layers of hard and fragile material, are separated by intermediate layers which are partially or totally constituted by a resilient material. When the intermediate layers are constituted only partially by resilient material, the portions which are not constituted by resilient material are constituted by a hard and fragile adhesive material.

The homogeneous or heterogeneous laminated strip may be produced by any suitable method and in particular using the methods described in French patent application FR 2 788 455. By way of example, and in order to produce a homogeneous laminated strip, it is possible to proceed in the following manner: whilst simultaneously unwinding, on the one hand, a roll of a strip of resistant and flexible adhesive polymer material, and a roll of a strip of fragile and thin metal material of a nanocrystalline material, the strip of thin metal material is adhesively-bonded to the strip of polymer material which is adhesive, flexible and resistant. A plurality of strips of this type are then produced constituted in this manner by a layer of flexible and resistant polymer material and an adhesive layer of thin metal material. A plurality of these laminated strips are then stacked in order to constitute a composite laminated strip comprising thin metal strips which are separated by layers of flexible and resilient adhesive polymer material. The laminated strip constituted in this manner is then subjected to a thermal processing operation which is intended to render the layers of adhesive polymer material hard and fragile.

It is also possible to proceed in the following manner: a first laminated strip is produced by adhesively-bonding a thin metal strip to a strip of flexible and resistant adhesive polymer material. The thin metal surface is then coated with a layer of an adhesive which will become hard and fragile after drying, such as, for example, an epoxy adhesive. A thin metal strip is then arranged on this layer of adhesive and is adhesively-bonded. The metal surface is then coated with a layer of adhesive which will become hard and fragile after drying, and a new thin metal strip is arranged on this layer of adhesive and is adhesively-bonded. The process is continued until a laminated strip is obtained with the desired thickness.

If a heterogeneous composite laminated strip is desired, a laminated strip of the desired thickness is first produced using one or other of the methods described above, then a strip having the desired features is adhesively-bonded to the surface of this laminated strip, for example, by means of serigraphy, that is to say, either a strip which is entirely resilient or a composite strip which is constituted by a resilient portion and a portion which is capable of becoming hard and fragile. A second laminated strip which has been produced using one or other of the methods described above is then arranged on this intermediate layer. If necessary, the operation is repeated as many times as desired.

The laminated strips which have been described above comprise a stack of a plurality of thin metal strips. However, the method is also suitable for laminated strips which comprise only one thin metal layer which is adhesively-bonded to a polymer layer.

Before carrying out the cutting by means of sandblasting, there is arranged, on the face of the laminated strip intended to receive jets of sand, a cover 4, 40, 400, or mask composed of a material which is resistant to sandblasting and which comprises openings 7, 70, 700 having the shapes according to which it is desirable to cut the laminated strip.

The cover can be produced in a number of manners.

In a first embodiment, the cover is a metal strip which is sufficiently thick, for example, of steel resistant to sandblasting, and which comprises cut-outs having the shapes according to which it is desirable to cut the laminated strip.

In another embodiment, the cover may be constituted by a strip of a resilient polymer material which also comprises suitable cut-outs. The material must be resilient in order to be able to resist sandblasting.

In a third embodiment, the cover is produced by depositing on the surface of the laminated strip a layer of resilient paint which is resistant to sandblasting, in accordance with patterns which correspond to the patterns according to which it is desirable to cut the laminated strip. This layer of paint is deposited, for example, by means of serigraphy.

It is also possible to deposit on the laminated strip a layer of photosensitive resin which is exposed to radiation, such as ultraviolet radiation or an electron beam through a mask which has the desired shape and which is developed in a bath which dissolves the non-irradiated portions.

When the cover is a cover of the "contact cover" type, that is to say, which is constituted by a plate which comprises openings, it is not possible to produce parts which are separate from each other just after sandblasting. However, when the cover is constituted, for example, by a layer of photosensitive resin, it is possible to produce components which are separate from each other and in particular small toruses which are arranged at the inner side of the toruses having a larger diameter.

These embodiments of covers are embodiments which are known per se to a person skilled in the art.

In order to be able to be handled more readily, the laminated strip 1, 10 or 100 can be arranged on a support strip 5, 50 or 500 or on a support plate which is constituted by a material having good mechanical strength and which is resistant to sandblasting. The laminated strip may be adhesively-bonded to this support strip using either a soluble adhesive or a resistant adhesive. The support strip can, according to the envisaged applications, be constituted by a resistant metal material, such as a steel, a resilient polymer material, or by a polymer material which comprises, at the inner face thereof, an electrically conductive metal layer, such as a layer of copper.

As illustrated in FIG. 6, in order to carry out the etching by means of sandblasting, the assembly constituted by the laminated strip 1, the cover 4, and optionally the support strip 5, is moved into a sandblasting chamber 80 below sandblasting nozzles 81 which project, at the upper surface, that is to say, the surface which comprises the cover, jets 82 of abrasive particles or abrasive sand. These abrasive particles are, for example, particles of aluminium or silicon. In the region of the openings 7 of the cover, the abrasive sand abrades the laminated strip until it reaches a layer which is resistant to abrasion. This abrasion of the laminated strip provides the etching and the cutting of the parts 6. This method described for a laminated strip according to FIG. 11 applies in the same manner to strips which correspond to the other embodiments of a laminated strip.

The sandblasting chamber may comprise a plurality of nozzles which provide a projection of abrasive particles over a plurality of zones. However, the zones do not necessarily cover the entire surface to be sandblasted. Therefore, to ensure that the whole of the surface to be sandblasted is sandblasted, it is possible to carry out an operation for passing over this surface by means of relative movements of the sandblasting nozzles and the strip to be sandblasted. These relative movements can be carried out, for example, by means of an alternating movement of the nozzles in a direction perpendicular relative to the axis of the strip to be sandblasted and by means of a movement of the strip to be sandblasted in a direction parallel with the axis thereof. When the support is a support plate, it can be arranged on a plate which is displaced with two movements in accordance with mutually perpendicular directions and which is parallel with the surface of the plate.

When the laminated strip 1 is a homogeneous laminated strip as illustrated in FIG. 1A, the jet of sand which passes through the openings 7 which are left free by the mask 4 abrades the strip over the entire thickness thereof until the support strip 5 is reached. A plurality of separate parts 6 and 6' are thus produced which are illustrated in FIG. 1B and whose thickness is constant and equal to the thickness of the laminated strip.

When the laminated strip is a composite laminated strip 10, as illustrated in FIG. 2A, comprising a continuous intermediate layer 33, the jets of sand penetrate via the spaces 70 left free by the mask 40 and abrade the upper laminated layer 11 of the laminated strip as far as the intermediate layer 33 of resilient material. A strip is thus produced which is illustrated in FIG. 2B and which is constituted by a first laminated layer 60 on which there are arranged laminated elements 61 which are separated by empty spaces. A laminated strip is thus produced whose thickness is not constant. This laminated strip may be, for example, a strip on which parallel strips have been etched which may constitute a diffraction network for electromagnetic waves.

When the laminated strip is a composite laminated strip 100, as illustrated in FIG. 3A, whose intermediate layer 330 is a partially resilient and partially fragile intermediate layer, the zones 700 which are left free by the mask in the region of the resilient intermediate layer 332 are etched only as far as the resilient intermediate layer 332 whilst, in the zones 710 left free by the mask in the region of the zones of the intermediate layer 331 which are hard and fragile, the etching is carried out as far as the support layer 500. Magnetic parts 600 are therefore produced which are illustrated in FIG. 3B and which may have portions 610, 620 of different thicknesses.

One example of carrying out the method for producing laminated nanocrystalline toruses is illustrated in FIG. 4 and FIG. 5. A laminated strip 13 constituted by a stack of adhesively-bonded nanocrystalline laminated strips is arranged on a support strip 15 and is adhesively-bonded to this strip using a soluble adhesive. There is arranged, on the upper face of the laminated strip 13, a cover 14 which comprises cut-outs 17 which delimit toruses 18A, 18B, 18C and 18D of various sizes, and these toruses 18A, 18B, 18C and 18D are connected by means of attachment points 19A, 19B, 19C and 19D to the remaining portions of the cover 14. This stack is sandblasted in order to be etched. During the sandblasting operation, the portions of the strip 13 which are in the region of the openings 17 are abraded completely until the sand reaches the support layer 15. After sandblasting, the cover 14 is removed. A cut laminated strip is thus produced which adheres to the support strip 15. The cut-outs of the laminated strip delimit parts 16A, 16B, 16C and 16D which are toruses in the form of washers and which remain attached to a peripheral portion of the laminated strip by means of attachment points. The cut laminated strip 13 is then cleaned, optionally coated with a protective polymer and separated from the support strip 5. A cut laminated strip 13' is thus produced, as illustrated in FIG. 5. The parts 16A, 16B, 16C and 16D of the cut laminated strip are then separated from the strip 13', optionally by means of sandblasting, and a plurality of toruses are thus produced which constitute parts for discrete magnetic electronic components. The toruses produced in this manner may have very different dimensions which can be from a few millimeters in diameter, even one millimeter in diameter, to several millimeters in diameter, with thicknesses which are from several tens of micrometers to a few hundreds of micrometers, or more, in accordance with the number of layers of nanocrystalline strips which have been stacked in order to produce the laminated strip. These toruses produced in this manner can be coated and then rolled in order to produce passive magnetic electronic components, such as inductors, transformers, rotors or stators for micromotors, or any other component of the magnetic type. Furthermore, the method allows toruses to be produced which have an air gap. To this end, it is sufficient to provide a radial cut which is sufficiently fine, for example, in the order of 1/10 mm wide or less.

As has been indicated above, when the laminated strip is a heterogeneous laminated strip comprising an intermediate layer of a material which is completely or partially resilient, magnetic parts are produced which have thick zones and thin zones. These parts may have different shapes which correspond to specific applications which are known to the person skilled in the art. As in the case above, after the sandblasting operation, the pre-cut laminated strip is cleaned, then the various elemental parts are separated and they are treated so that they can subsequently be used as parts which are incorporated in electronic components. These components are, for example, inductors, transformers, filters, antennae, rotors or stators of micromotors for watches.

The method as described above allows discrete electronic components to be produced. However, it also allows electronic components to be produced which are incorporated in printed circuits.

In order to produce magnetic electronic components which are incorporated in printed circuits, it is possible to proceed in various manners. It is in particular possible to arrange the laminated strip constituted by stacked nanocrystalline strips on a support plate which is constituted, on the one hand, by a layer of polymer material which is capable of becoming one of the layers of a printed circuit, this polymer layer being coated on the lower face thereof with a layer of copper which can be etched by means of chemical etching in order to form conductive elements as done in a manner known per se in the production of printed circuits. The laminated strip is adhesively-bonded to the support plate by means of a resilient protective adhesive so that the sandblasting operation which cuts the part from the laminated strip does not cut the polymer support plate. After the laminated strip has been cut, in order to form a part for a passive inductive electronic component, the assembly is cleaned but the part produced is not detached from the support plate. On the contrary, this part is left on the support plate. As illustrated in FIG. 7A, a plate 51 is produced to which an inductive electronic component part 54 in the form of a torus is adhesively-bonded. The plate 51 comprises a layer 52 of polymer material to which the electronic component part 54 is adhesively-bonded, and a lower layer 53 of copper. Using an adhesive which is sufficiently fluid to fill all the cavities without leaving bubbles, a second plate 55 constituted by a layer 56 of polymer material and an upper layer 57 of a conductive material, such as copper, is adhesively-bonded to the upper face of the plate provided with the part 54 thereof. The layers 53 and 57 of copper are then etched by means of chemical etching in order to form conductors 58 which are arranged radially relative to the torus 54 which is contained between the two outer layers 51 and 55 of the printed circuit illustrated in FIG. 7B. The conductors 58 of the upper face and the lower face are connected by conductive passages 59 which are constituted by holes whose walls are covered with a conductive material so as to form windings. A printed circuit is thus obtained comprising an integrated transformer or inductor. The technique for producing conductors is a technique known per se in the production of printed circuits. It should be noted that the etching of the conductors in the layers of copper may be carried out, not after assembly of the plates which constitute the printed circuit, but before this operation. The order in which these operations are carried out is simply a matter of ease of production.

In a specific embodiment, and in order to prevent excessive thicknesses between the upper layer and the lower layer of the printed circuit, it is possible to proceed by depositing on the lower layer of the printed circuit a single nanocrystalline layer, then producing a plurality of intermediate layers constituted by a polymer which is compatible with the production of printed circuits on which a nanocrystalline layer which is etched by means of sandblasting is arranged, and a plurality of intermediate layers are stacked so that the toruses of the intermediate layers are located facing each other. The whole is then covered with a layer of polymer material which comprises a layer of copper, and the connections are produced by means of chemical etching and the holes whose walls are coated with conductive material are drilled. It is also possible to drill the holes first and cover the walls thereof with a conductive material, then to etch the connections.

It is also possible to proceed by producing on a support plate a magnetic circuit, such as a torus, having a relatively large thickness of a few tenths of a millimeter, or one millimeter or more, then arranging on this first support plate layers of polymer material in which a recess will be provided which is in the form or a torus and which will fit around the torus, filling the interstices around the torus with a resin which is sufficiently fluid not to leave bubbles, then covering the whole with a surface layer of polymer material which is coated with a copper layer on which it is possible to etch connections.

In this production method, the support layer on which the laminated strip has been deposited which is intended to be cut may comprise beforehand electronic circuits which must be protected during the sandblasting operation. To this end, prior to the sandblasting, a protective layer of a resilient material which is resistant to sandblasting is arranged on the support layer.

Using this method, it is possible to produce printed circuits which comprise magnetic circuits which are incorporated in the thickness of the printed circuit. This technique may also be applied to the production of electronic cards, for example, chip cards, in which it is possible to incorporate an inductive magnetic circuit, such as a self-inducting roll or a transformer. It is also possible to incorporate magnetic circuits which can be used as an antenna or any other type of magnetic circuit known to a person skilled in the art.

It should be noted that the support plates of polymer material can be composite plates which are constituted by a woven material which is impregnated with resin generally used in the production of printed circuits.

The invention as described above is also applicable to the production of passive electronic components which are constituted by materials other than nanocrystalline materials, provided that these materials are metal materials which are in the form of thin, hard and fragile strips, that is to say, which are capable of being etched by means of sandblasting. These materials are, for example, materials such as some iron-cobalt, iron-platinum, iron-silicon, iron-nickel alloys, some alloys of the nickel-chromium type, or some alloys of molybdenum or some alloys of tungsten. These alloys are known to the person skilled in the art.

The passive electronic components which are produced using this method may also be electronic components of the capacitive or resistive type. In order to produce components of this type, it is sufficient to add connections to the metal faces of the components produced. By way of example, in order to produce a capacitive component, it is sufficient to produce a connection on a metal layer and a connection on another metal layer, the two metal layers being separated by at least one insulating layer which has suitable dielectric properties. In order to produce a resistive component, it is sufficient to create two electrical connections on the same metal layer.

In the method as described above, only a single sandblasting operation has been envisaged; however, in order to produce specific geometries, or for reasons of productivity, it may be advantageous to carry out the cutting operation by means of a plurality of successive sandblasting operations which are carried out using different masks. A production method which comprises a plurality of successive sandblasting operations also forms part of the invention.

Finally, the method may apply to the cutting of parts from laminated strips comprising a single thin and fragile metal strip or a thin and fragile metal strip which is adhesively-bonded to a resilient polymer strip which is resistant to sandblasting and which can be adhesively-bonded to a laminated strip comprising one or more thin and fragile metal strips and optionally one or more layers of a hard and fragile adhesive material.

The invention claimed is:

1. A part comprising:
laminate having at least one stack formed by alternately stacking a thin and fragile metal strip and a layer of an adhesive material,
wherein the part is a core of a passive inductive electronic component, and
wherein the thin and fragile metal strip is made of an alloy taken from a nanocrystalline alloy, or a hard and fragile alloy of the type iron-cobalt, iron-platinum, iron-silicon, or iron-nickel, or nickel-chrome or an alloy of molybdenum or tungsten.

2. The part according to claim 1, wherein the part comprises an air gap.

3. The part according to claim 1, wherein the part is a torus having a thickness of less than 1 mm.

4. The part according to claim 3, wherein the torus has a diameter greater than 10 mm.

5. The part according to claim 3, wherein the torus has a thickness of between 20 µm and 200 µm and a diameter which is at least 1 mm.

6. The part according to claim 1, wherein the part comprises at least two parts having different thicknesses.

7. A plate which is intended to be incorporated in a printed circuit comprising:
- a layer of conductive material and a layer of resilient polymer material, to which there is adhesively-bonded at least one passive electronic component part which is cut from a laminated strip,
- wherein the passive electronic component part is a part according to claim 1, and the laminated strip being provided on a support strip or a plate comprising a layer of polymer and a layer of a conductive material such as copper.

8. A plate which is intended to be incorporated in a printed circuit comprising:
- a layer of conductive material and a layer of resilient polymer material, to which there is adhesively-bonded at least one passive electronic component part which is cut from a laminated strip,
- the laminated strip having at least one stack formed by alternately stacking a thin and fragile metal strip and a layer of an adhesive material,
- the laminated strip being provided on a support strip or a plate comprising a layer of polymer and a layer of a conductive material such as copper, and
- wherein the thin and fragile metal strip is made of an alloy taken from a nanocrystalline alloy, or a hard and fragile alloy of the type iron-cobalt, iron-platinum, iron-silicon, or iron-nickel, or nickel-chrome or an alloy of molybdenum or tungsten.

9. The method for producing a printed circuit comprising at least one passive electronic component which comprises at least one part which is constituted by a laminated metal material, wherein at least one plate is stacked and adhesively-bonded according to claim 8 and at least one plate comprising a layer of polymer material.

10. A part comprising:
- laminate having at least one stack formed by alternately stacking a thin and fragile metal strip and a layer of an adhesive material,
- the laminate being optionally provided on a support strip or a plate comprising a layer of polymer and a layer of a conductive material such as copper,
- wherein the part is a part for a passive electronic component optionally incorporated in a printed circuit, and
- wherein the thin and fragile metal strip is made of an alloy taken from a nanocrystalline alloy, or a hard and fragile alloy of the type iron-cobalt, iron-platinum, iron-silicon, or iron-nickel, or nickel-chrome or an alloy of molybdenum or tungsten.

11. The part according to claim 10, wherein the part is a core of a passive inductive electronic component.

12. The part according to claim 11, wherein the part comprises an air gap.

13. The part according to claim 12, wherein the part is a torus having a thickness of less than 1 mm.

14. The part according to claim 13, wherein the torus has a diameter greater than 10 mm.

15. The part according to claim 13, wherein the torus has a thickness of between 20 μm and 200 μm and a diameter which is at least 1 mm.

16. The part according to claim 10, wherein the part comprises at least two parts having different thicknesses.

17. A part according to claim 10,
wherein the part is a fitting for an electrical capacitor.

18. A part according to claim 10,
wherein the part constitutes an electrical resistor.

* * * * *